(12) United States Patent
Hyodo

(10) Patent No.: US 7,151,671 B2
(45) Date of Patent: Dec. 19, 2006

(54) POWER SUPPLY

(75) Inventor: Jun Hyodo, Atsugi (JP)

(73) Assignee: Tokyo R & D Co., Ltd., Tokyo (JP)

( * ) Notice: Subject to any disclaimer, the term of this patent is extended or adjusted under 35 U.S.C. 154(b) by 312 days.

(21) Appl. No.: 10/497,688

(22) PCT Filed: Nov. 28, 2002

(86) PCT No.: PCT/JP02/12471

§ 371 (c)(1),
(2), (4) Date: Jun. 4, 2004

(87) PCT Pub. No.: WO03/049518

PCT Pub. Date: Jun. 12, 2003

(65) Prior Publication Data

US 2005/0078454 A1    Apr. 14, 2005

(30) Foreign Application Priority Data

Dec. 4, 2001    (JP) ............... 2001-369743

(51) Int. Cl.
*H05K 7/20* (2006.01)
*H01L 23/36* (2006.01)
*H01L 23/12* (2006.01)

(52) U.S. Cl. .............. 361/717; 361/710; 361/713; 257/707; 257/717

(58) Field of Classification Search .......... 361/712, 361/704–707, 709–715, 717; 257/713, 717, 257/722, 706, 707
See application file for complete search history.

(56) References Cited

U.S. PATENT DOCUMENTS

| | | | | |
|---|---|---|---|---|
| 3,261,396 A | * | 7/1966 | Trunk | 165/80.3 |
| 3,766,977 A | * | 10/1973 | Pravda et al. | 165/47 |
| 3,893,161 A | * | 7/1975 | Pesak, Jr. | 257/718 |
| 4,204,248 A | * | 5/1980 | Proffit et al. | 361/707 |
| 4,344,106 A | * | 8/1982 | West et al. | 361/717 |
| 4,387,413 A | * | 6/1983 | Griffis | 361/717 |
| 4,626,982 A | * | 12/1986 | Huber | 363/80 |
| 4,669,028 A | * | 5/1987 | Faa, Jr. | 361/717 |
| 4,707,726 A | * | 11/1987 | Tinder | 174/252 |
| 4,766,653 A | * | 8/1988 | Della Porta | 24/563 |
| 4,950,427 A | * | 8/1990 | Endo | 257/719 |
| 5,450,284 A | * | 9/1995 | Wekell | 361/710 |
| 5,917,701 A | * | 6/1999 | Solberg | 361/704 |

* cited by examiner

*Primary Examiner*—Anatoly Vortman
(74) *Attorney, Agent, or Firm*—Takeuchi&Kubotera LLP

(57) ABSTRACT

A power supply comprising switching elements (20), wherein the power supply is provided with first heat sinks (30) having electrical conductivity to which the switching elements are fitted and a second heat sink (40) mounted with the first heat sinks which are electrically insulated, and first heat sink is used as one terminal for the switching elements, and the first heat sinks each having a projection, to be in contact with outside terminals (81), (82).

4 Claims, 12 Drawing Sheets

POWER SUPPLY

TECHNICAL FIELD

The present invention relates to a power supply comprised of switching elements, wherein thermal resistance to heat radiation from the switching elements is reduced to secure a satisfactory performance of the power supply and to rationalize the connection structure with outside terminals.

BACKGROUND ART

A power supply for supplying a prescribed device with power is comprised of switching elements. The switching elements are elements which provide a circuit network with a switching function without providing a make-and-break contact, and their typical example includes a silicon transistor. Especially, the switching elements for supplying the power require a large output to some extent and are mounted on a heat sink to deal with heat generation.

The above-described power supply is desired to have a higher performance and is inexpensive. Specifically, it is significant that the switching elements have a high rated temperature, the connection with outside terminals is made easy, the structure is simple, productivity and cost are good, and it is lightweight and small.

The present invention has been made in view of the above requirements and provides a power supply that thermal resistance to heat radiation from switching elements is reduced, and the connection structure with outside terminals is rationalized.

DISCLOSURE OF THE INVENTION

The power supply comprises a switching element, wherein the power supply is provided with a first heat sink having electrical conductivity to which the switching element is fitted and a second heat sink on which the first heat sink which is electrically insulated is mounted, the first heat sink is used as one terminal for the switching element, and the first heat sink has a projection, which is brought into contacted with an outside terminal. By configuring as described above, thermal resistance by the heat radiation from the switching element can be lowered, and the connecting structure with the outside terminal can be rationalized.

Specifically, heat generated from the switching element is conducted from the switching element to the first heat sink, then from the first heat sink to the second heat sink. Thus, the switching element has a good heat radiation property.

The first heat sink has electrical conductivity and can be used as one terminal for the switching element. Besides, the first heat sink has a projection which comes into contact with the outside terminal, the first heat sink and the outside terminal are mutually connected accurately and efficiently by using the projection.

The opposed areas between the first heat sink and the second heat sink are larger than that between the switching element and the first heat sink.

When the first heat sink and the second heat sink are electrically insulated, thermal resistance between them becomes large. Therefore, according to the present invention, the opposed areas between the first heat sink and the second heat sink are set to be larger than that between the switching element and the first heat sink in order to secure a balance between the amount of heat conducted from the switching element to the first heat sink and that conducted from the first heat sink to the second heat sink.

The first heat sink is a metal plate formed in the shape of a letter L.

Specifically, as the first heat sink a metal plate formed in the shape of a letter L can be used. According to the present invention, the metal plate is attached to the second heat sink, and the portion erected from the second heat sink is determined as the projection which is brought into contacted with the outside terminal.

The projection of the first heat sink and the outside terminal are each provided with a connector, and the projection and the outside terminal are contacted with each other by connecting the connectors mutually.

Thus, by connecting the connectors mutually to contact the projection and the outside terminal, the work to connect the power supply and the outside terminal is facilitated and very convenient.

The power supply is provided with the switching element and the first heat sink in plural, and at least one of the first heat sinks is mounted with at least two of the switching elements so that electrodes have the same potential.

Thus, mounting the plural switching elements, so that the electrodes have the same potential, to a single first heat sink can eliminate the necessity of wiring for connection to the individual electrodes of the switching elements, and can further simplify the construction.

BEST MODE FOR CARRYING OUT THE INVENTION

An embodiment of the invention will be described in detail with reference to the accompanying drawings.

A power supply 1 of this embodiment shown in FIG. 1 to FIG. 12 supplies a DC motor coil with power. This DC motor is a running motor which is mounted, together with a battery as a power source, on an electric vehicle and runs the vehicle according to the driving operation by a driver.

Figure 10:
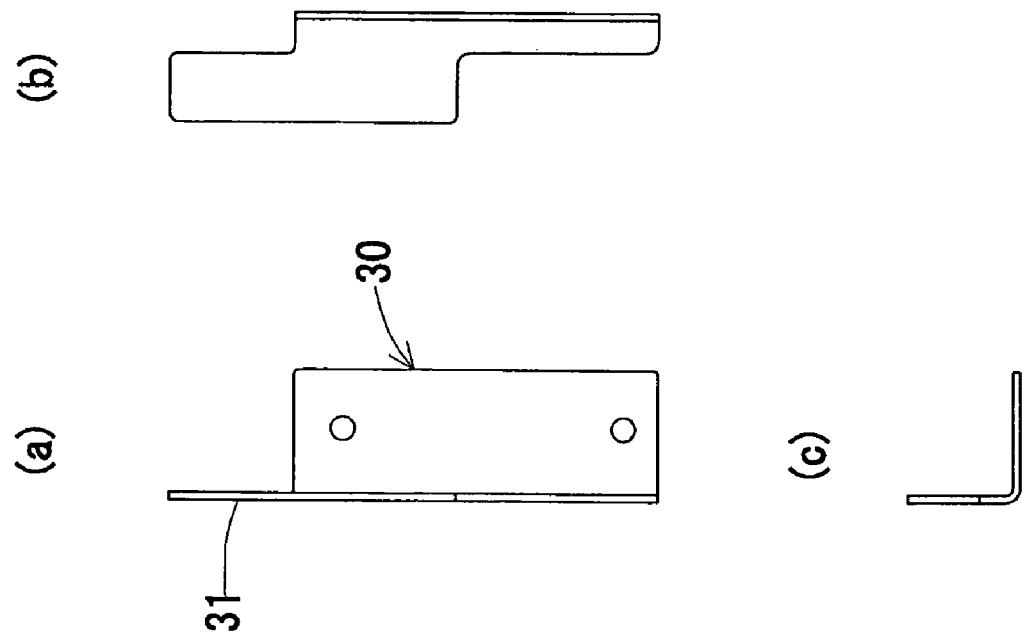
FIG. 10(a) is a front view.
FIG. 10(b) is a right side view and FIG. 10(c) is a bottom view of the first heat sink according to the embodiment of the present invention.
Figure 11:
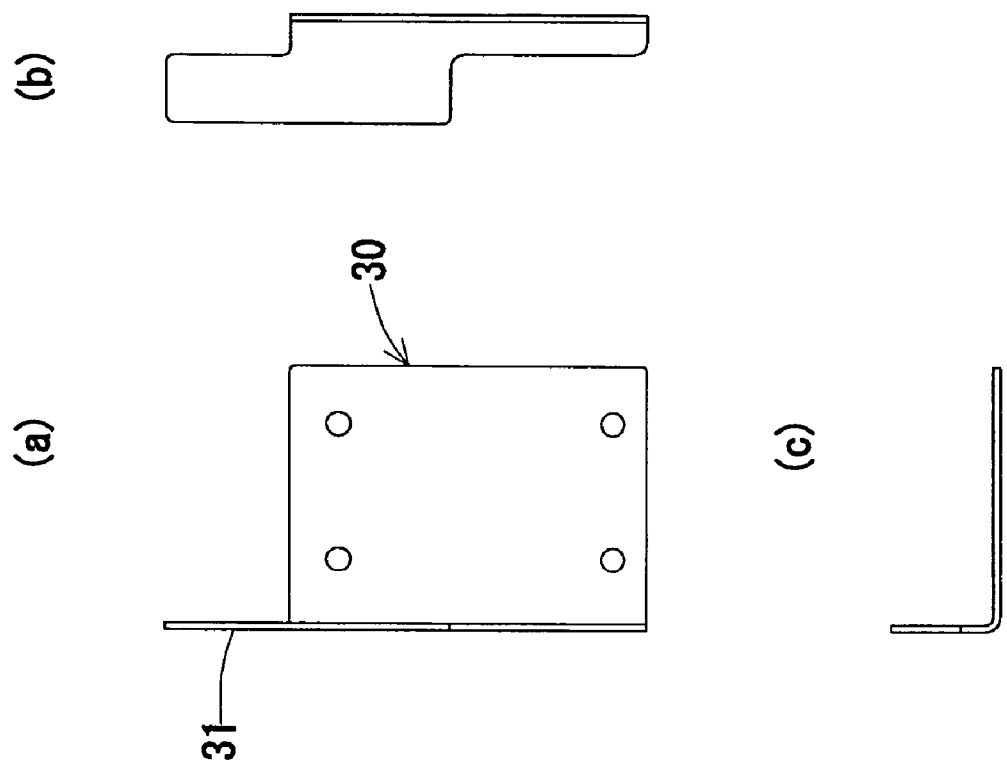
FIG. 11(a) is a front view.
FIG. 11(b) is a right side view and FIG. 11(c) is a bottom view showing the first heat sink according to the embodiment of the present invention.
Figure 12:
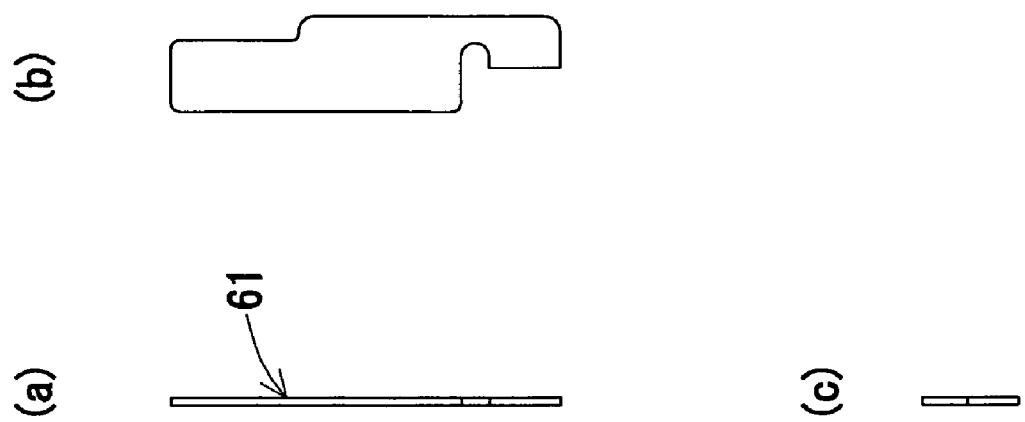
FIG. 12(a) is a front view.
FIG. 12(b) is a right side view and FIG. 12(c) is a bottom view showing a terminal member according to the embodiment of the present invention.

As shown in the drawings (typically in FIG. 4), the power supply 1 is provided with a plurality of switching elements 20, a plurality of first heat sinks 30 having electrical conductivity to which a single or a plurality of switching elements 20 are fitted, a second heat sink 40 to which the plurality of first heat sinks 30 are fitted, an insulation sheet 50 is interposed between the first heat sinks 30 and the second heat sink 40, a circuit board 60 to which a terminal 21 of each switching element 20 is connected, and a cover 70 for holding them. A terminal member 61 contacted to an outside terminal, a controller connector 62, capacitors 63, a coil 64, relays 65, etc. are disposed on the circuit board 60. The first heat sink 30 shown in FIG. 10 is fitted with a single switching element 20, and the first heat sink 30 shown in FIG. 11 is fitted with the plurality of switching elements 20.

The switching element 20 of this embodiment is a voltage-control type FET wherein a flow of electrons in a semiconductor is controlled by another electrode. Current flowing from the power source to the motor coil is switched by the circuit board 60 for controlling the voltages of the plurality of switching elements 20. A signal for controlling is input from the controller connector 62.

The individual first heat sinks 30 have a portion, which is used as one terminal of the switching element 20 and opposed to the second heat sink 40, and a projection 31, which projects from the opposed portion and contacts an outside terminal. In this embodiment, the first heat sink 30 is a metal plate formed in the shape of a letter L, its one portion is fixed to the second heat sink 40, and the other portion erected from the second heat sink 40 is determined as the projection 31, which is brought into contact with an outside terminal. The second heat sink 40 is a metal plate having a prescribed area.

The heat generated in the switching element 20 is transferred to and diffused from the first heat sink 30 and the second heat sink 40. Especially, the present embodiment has an advantage that heat is also radiated from the projections 31 of the first heat sinks 30. Opposed areas between the first heat sink 30 and the second heat sink 40 are set to be larger than that between the switching element 20 and the first heat sink 30 considering a thermal resistance by the insulation sheet 50. The second heat sink 40 may be provided with heat radiation means such as a fin. The heat radiation property of the switching element 20 is further improved by such heat radiation means.

Figure 1:
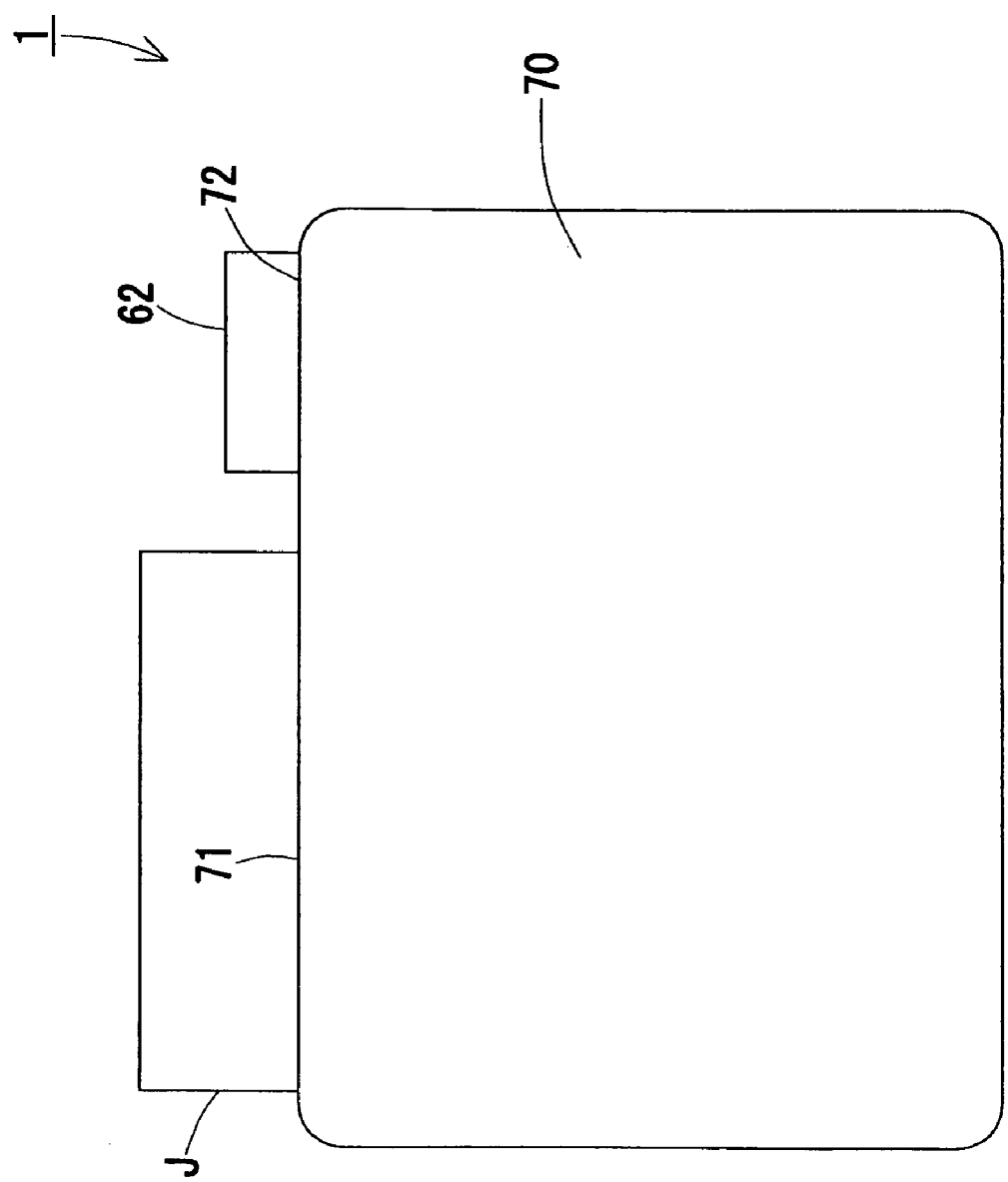
FIG. 1 is a front view showing a power supply according to an embodiment of the present invention.
Figure 2:
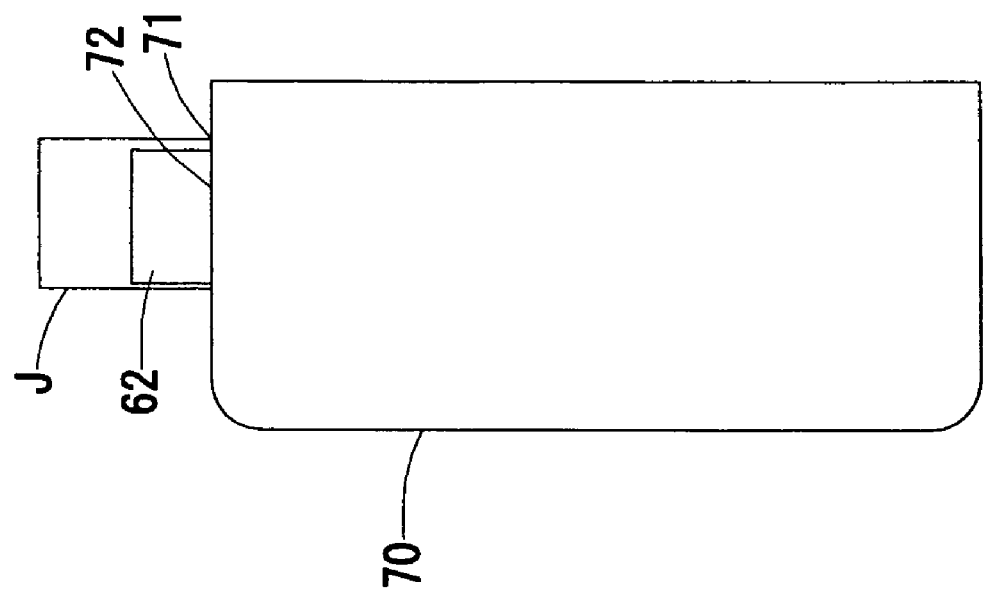
FIG. 2 is a right side view showing the power supply according to the embodiment of the present invention.
Figure 3:
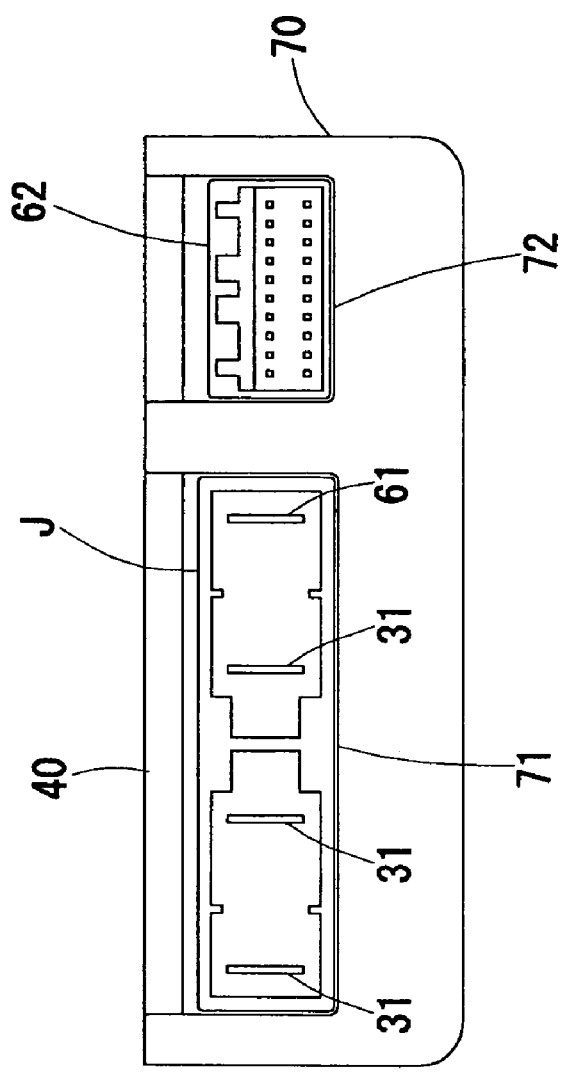
FIG. 3 is a top view showing the power supply according to the embodiment of the present invention.
Figure 4:
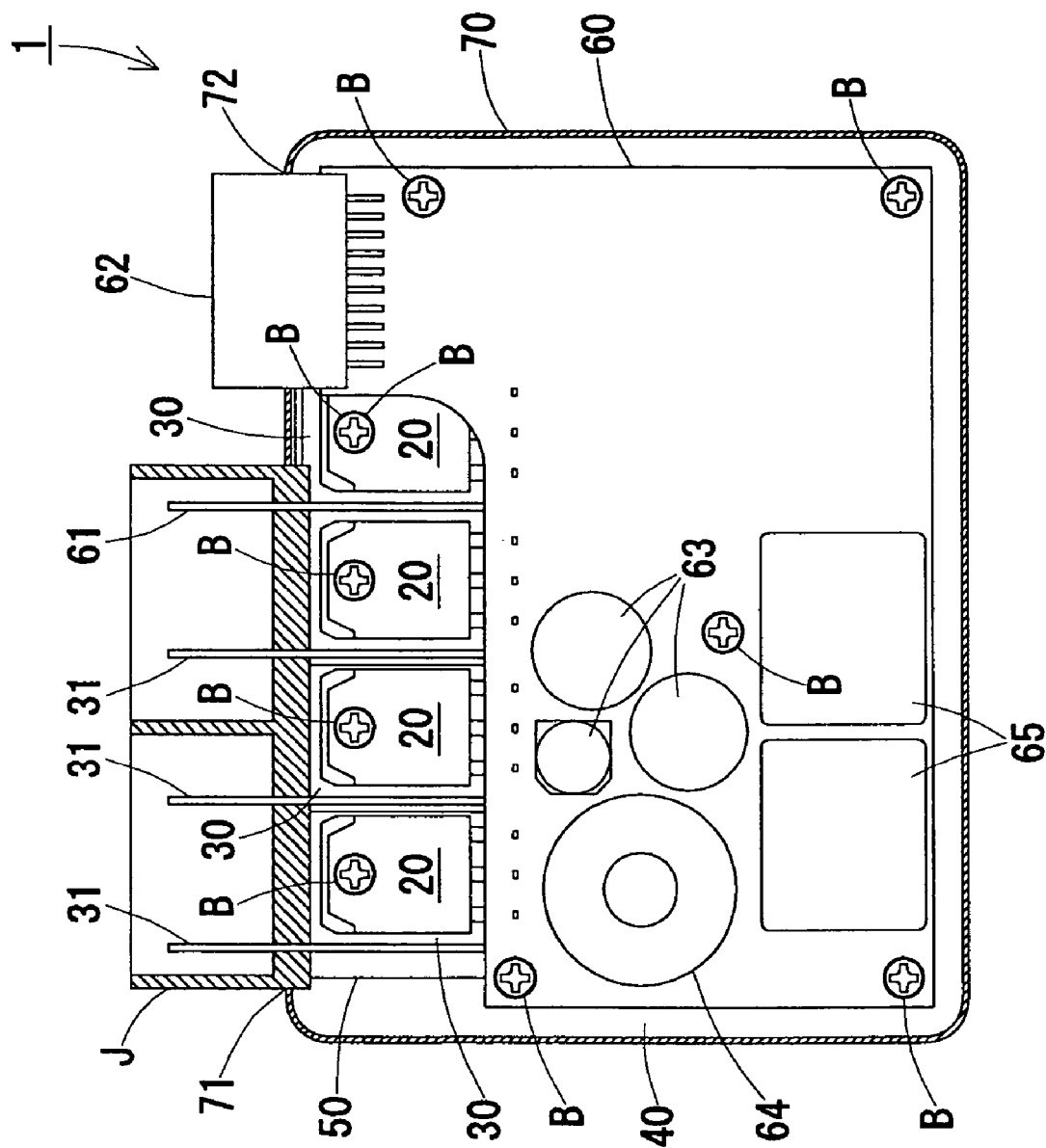
FIG. 4 is a front view showing the interior of the power supply according to the embodiment of the present invention.
Figure 5:
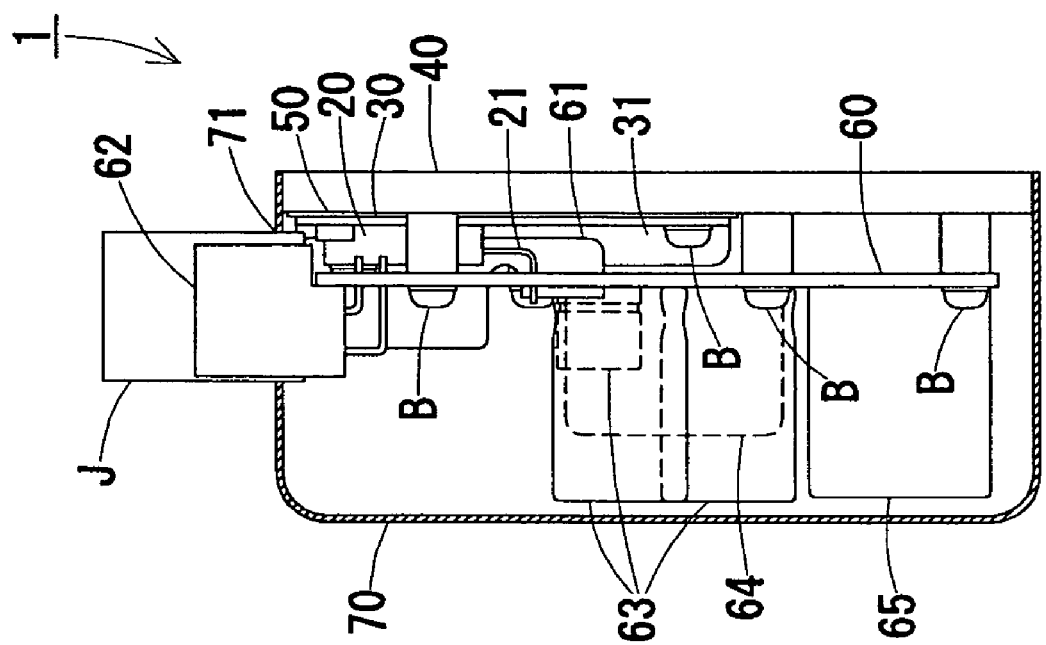
FIG. 5 is a right side view showing the interior of the power supply according to the embodiment of the present invention.
Figure 6:
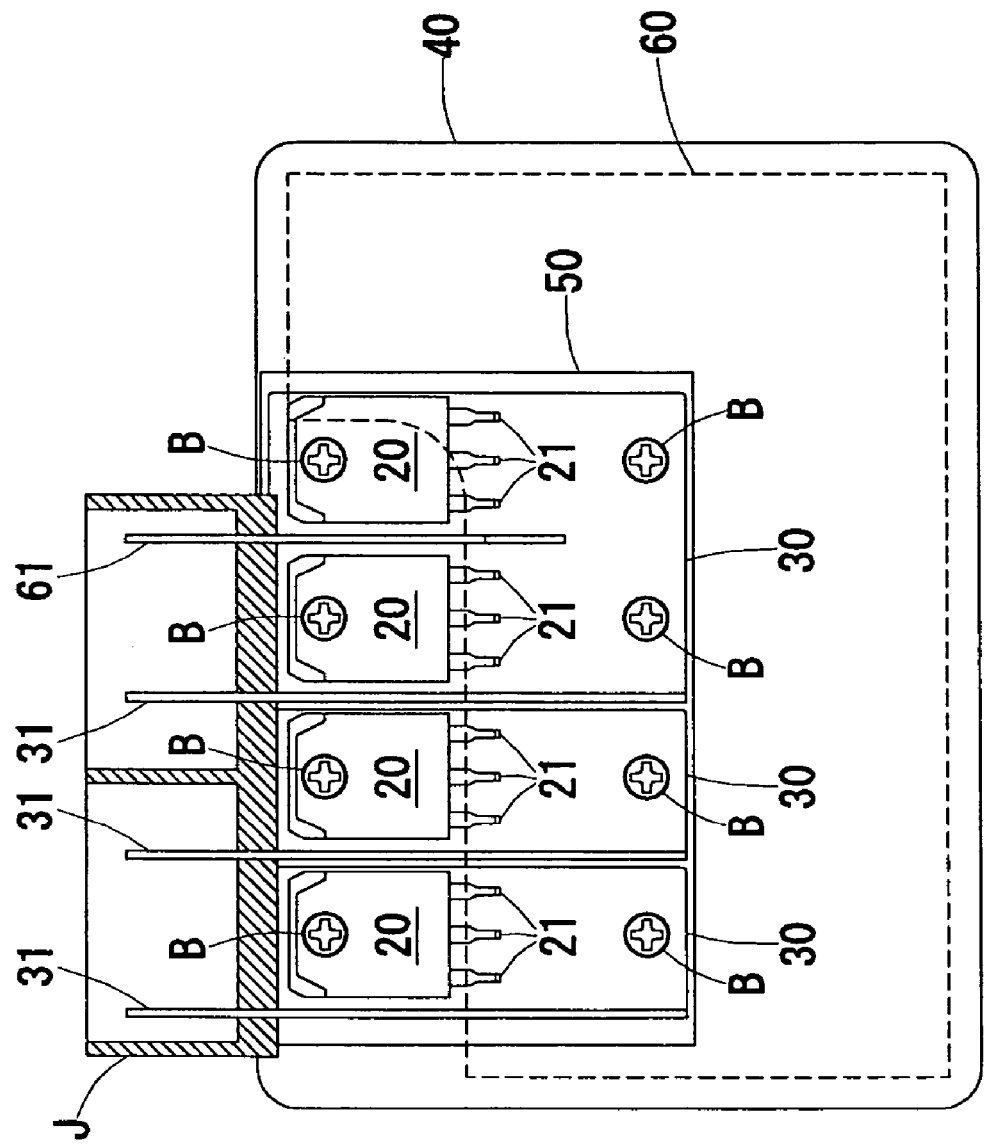
FIG. 6 is a front view showing switching elements, first heat sinks and a second heat sink according to the embodiment of the present invention.
Figure 7:
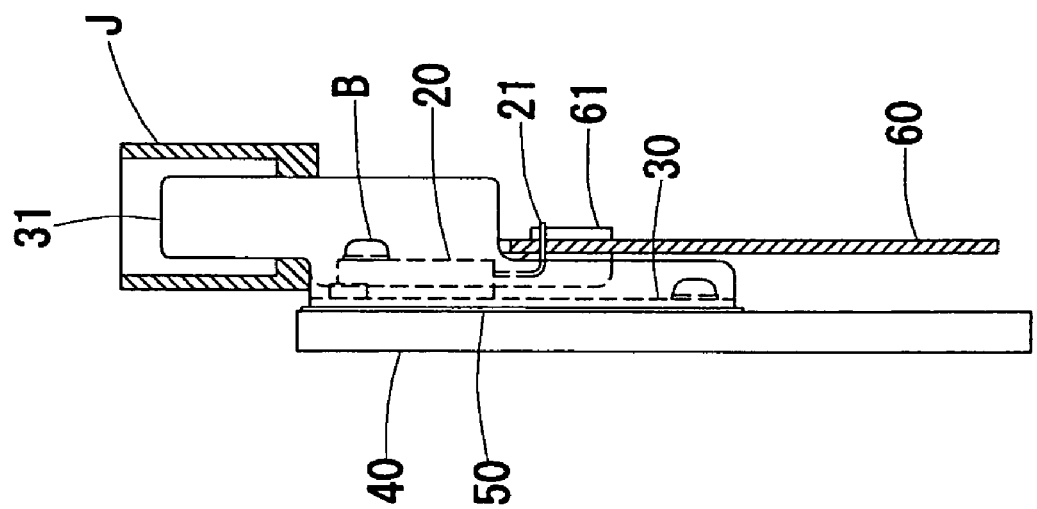
FIG. 7 is a left side view showing the switching element, the first heat sink and the second heat sink according to the embodiment of the present invention.
Figure 8:
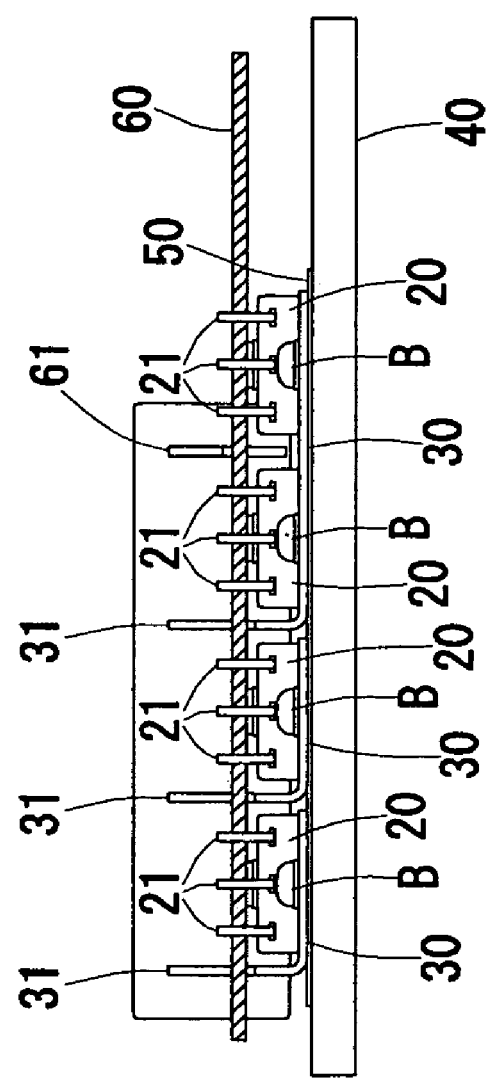
FIG. 8 is a bottom view showing the switching elements, the first heat sinks and the second heat sink according to the embodiment of the present invention.
Figure 9:
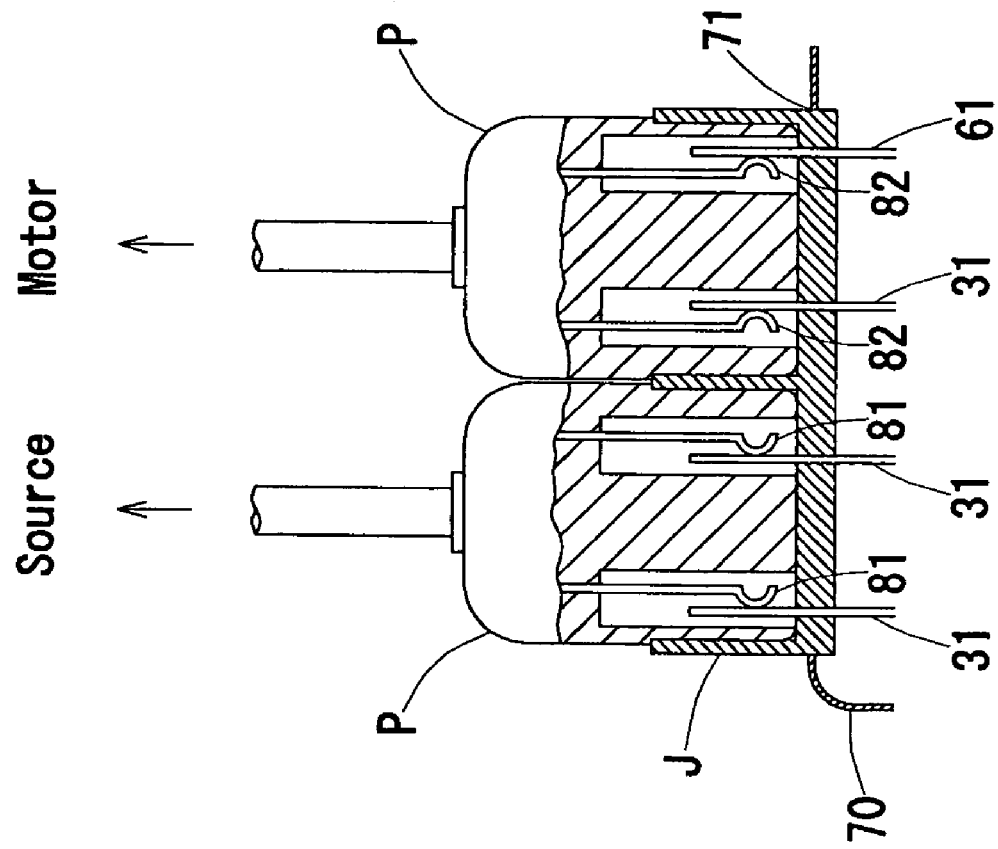
FIG. 9 is an explanatory diagram showing the connection between projections of the first heat sinks and outside terminals according to the embodiment of the present invention.

The outside terminals of this embodiment include power source-side terminals 81 and motor-side terminals 82 (see FIG. 9). And the power supply 1 is configured to have the projections 31 of the plurality of adjacent first heat sinks 30 connected to the power source-side terminals 81, and have the projections 31 of the other first heat sinks 30 and the terminal member 61 of the circuit board 60 connected to the motor-side terminals 82. Here, the other first heat sink 30 is mounted with the plurality of switching elements 20 so that the electrodes have the same potential. In other words, a single first heat sink 30 is used as the electrode for the plurality of switching elements 20 thereby to simplify the construction.

Besides, the contact between the projections 31 of the first heat sinks 30 and the outside terminals, and also the contact between the terminal member 61 of the circuit board 60 and the outside terminal, are effected by joining connectors provided on the projections 31 and the terminal member 61 with connectors provided on the outside terminals. Specifically, it is configured to provide the prescribed connection by having the projections 31 and the terminal member 61 each provided with a jack J as a connector and the power source-side terminals 81 and the motor-side terminals 82 each provided with a plug P as a connector, and the individual plugs P are inserted into the jacks J. The jacks J and the plugs P of this embodiment are members formed of a resin having an excellent heat resistance.

The cover 70 is provided with a first opening 71, which exposes the projections 31 of the first heat sinks 30 and the terminal member 61 of the circuit board 60, and a second opening 72, which exposes the controller connector 62 of the circuit board 60. The projections 31 and the terminal member 61 are externally protruded through the first opening 71 of the cover 70, and the jack J is fitted in the peripheral edges of the first opening 71.

The projections 31 and the terminal member 61 may have a hole or a notch formed in appropriate portions in order to avoid an increase in temperature at a portion where it contacts with the outside terminals. In other words, the conduction of heat from the switching elements 20 to the contacting portions between the projections 31 and the outside terminals can be somewhat prevented by forming the hole or the notch. If the projections 31 or the terminal member 61 is somewhat degraded in strength under the influence of the hole or the notch, the periphery of the hole or the notch may be reinforced by holding it by the jack J.

The power supply 1 is assembled by first positioning the switching elements 20, the first heat sinks 30, the second heat sink 40 and the insulation sheet 50 by using a jig or the like and securing them by a plurality of bolts B (see FIG. 4 to FIG. 8). Through-holes through which the bolts B are inserted and female thread portions for screwing the bolts B are formed in the pertinent portions of the individual members.

Thus, the switching elements 20 are secured to the first heat sinks 30 by screwing, and the first heat sinks 30 are secured to the second heat sink 40 by screwing. Here, the first heat sinks 30 and the second heat sink 40 must be electrically insulated, so that the bolts B are made of an insulator. Otherwise, the metal bolts B may be used in combination with a boss formed of an insulator. To fix the switching elements 20, the first heat sinks 30 and the second heat sink 40, fitting with grommets, riveting or the like may be used other than the screwing.

Then, the circuit board 60, on which the terminal member 61, the controller connector 62, the capacitors 63, the coil 64 and the relays 65 are fixed, is positioned with respect to the switching elements 20 and the second heat sink 40, then the second heat sink 40 and the circuit board 60 are secured by the plurality of bolts B, and the terminals 21 of the switching elements 20 are soldered to the circuit board 60. Through-holes through which the bolts B are inserted and female thread portions for screwing the bolts B are respectively formed in the pertinent portions of the second heat sink 40 and the circuit board 60.

The jack J is fitted to the projections 31 of the first heat sinks 30 and the terminal member 61 of the circuit board 60, and the cover 70 is fitted to cover the circuit board 60.

The cover 70 of this embodiment is supported by the edge portion of the second heat sink 40; the switching elements 20, the first heat sinks 30, the insulation sheet 50 and the circuit board 60 are contained in a casing comprised of the cover 70 and the second heat sink 40. The power supply 1 has been formed as a unit by using the cover 70.

The above embodiment has been described as a power supply as an example which supplies the DC motor coil with power, but the present invention can also be applied to a power supply which supplies another motor (e.g., a DC brushless motor) with power or a power supply which supplies any devices other than the motors with power. The number and combination of the switching elements and the first heat sinks are determined in accordance with a prescribed power-supplied device.

INDUSTRIAL APPLICABILITY

The power supply of the present invention lowers the thermal resistance caused by the radiation of heat from the switching elements and rationalizes the configuration of connection with the outside terminals, and it is suitable as a general power supply including a power supply for supplying a DC motor with power.

The invention claimed is:

1. A power supply to be connected to an outside terminal of a first connector, comprising:
    a switching element,
    a first heat sink having electrical conductivity to which the switching element is fitted,
    a second heat sink mounted with the first heat sink which is electrically insulated and uses the first heat sink as one terminal for the switching element,
    a projection extending from the first heat sink for contact with the outside terminal, and
    a second connector for supporting the projection such that the projection and the outside terminal are contacted by connecting the first and second connectors mutually.

2. The power supply according to claim 1, wherein the opposed areas between the first heat sink and the second heat sink are larger than that between the switching element and the first heat sink.

3. The power supply according to claim 1 or 2, wherein the first heat sink is a metal plate formed in the shape of a letter L.

4. The power supply according to claim 1 or 2, wherein the power supply is provided with the switching element and the first heat sink in plural, and at least one of the first heat sinks is provided with at least two of the switching elements so that electrodes have the same potential.

* * * * *